United States Patent

Sato et al.

Patent Number: 6,136,092
Date of Patent: Oct. 24, 2000

[54] QUART CRUCIBLE WITH LARGE DIAMETER FOR PULLING SINGLE CRYSTAL AND METHOD OF PRODUCING THE SAME

[75] Inventors: Tatsuhiro Sato; Shigeo Mizuno; Mitsuo Matsumura; Hiroyuki Watanabe, all of Takefu, Japan

[73] Assignee: Shin Etsu Quartz Products Co., Ltd., Tokyo, Japan

[21] Appl. No.: 09/377,103

[22] Filed: Aug. 19, 1999

Related U.S. Application Data

[62] Division of application No. 09/153,066, Sep. 15, 1998, Pat. No. 5,989,021.

[30] Foreign Application Priority Data

Mar. 14, 1996 [JP] Japan ......................... 8-57924

[51] Int. Cl.[7] ............................................. C30B 23/00
[52] U.S. Cl. ............................ 117/84; 65/18.1; 65/18.2; 428/34.6; 432/264
[58] Field of Search ................. 65/18.1, 18.2; 428/34.6; 432/264

[56] References Cited

U.S. PATENT DOCUMENTS

| | | |
|---|---|---|
| 4,416,680 | 11/1983 | Bruning et al. . |
| 4,911,896 | 3/1990 | Bihuniak et al. . |
| 4,935,046 | 6/1990 | Uchikawa et al. ................. 65/18.2 |
| 4,956,208 | 9/1990 | Uchikawa et al. ................. 428/34.6 |
| 5,308,446 | 5/1994 | Bihuniak et al. . |
| 5,989,021 | 11/1999 | Sato et al. ......................... 432/264 |

OTHER PUBLICATIONS

Abstract of Japanese Patent Publication No. 09020586, dated Jan. 21, 1997.
Abstract of Japanese Patent Publication No. 3-208880, dated Sep. 12, 1991.

Primary Examiner—Felisa Garrett
Attorney, Agent, or Firm—Arent Fox Kintner Plotkin & Kahn PLLC

[57] ABSTRACT

A crucible with 22 inches or more in inner diameter, which has a small deformation of the body under exposure to abundant heat radiation during pulling a single crystal, and which has no practical problem, and a method of producing the same are disclosed. The method comprises the steps of: feeding first silicon dioxide powder along an inner surface of a rotating mold having a gas permeable wall to form a piled up layer of the first silicon dioxide powder; heating the piled up layer from the inside space of the mold to have the first silicon dioxide powder molten to provide the opaque outer layer as a substrate, while vacuum suction is effected through the wall; generating a high temperature gas atmosphere in an inside space of the substrate during or after the formation of the opaque outer layer; feeding second silicon dioxide powder into the high temperature gas atmosphere to have the second silicon dioxide powder molten at least partly; and directing the second silicon dioxide powder in an at least partly molten form toward an inner surface of the substrate to have the second silicon dioxide powder deposited on the inner surface of the substrate to thereby form the transparent inner layer thereon, the transparent inner layer being of a predetermined thickness and substantially free of bubbles.

2 Claims, 5 Drawing Sheets

| Sample No. | Items | Measuring Positions | | | | | |
|---|---|---|---|---|---|---|---|
| | | Cylindrical Portion | | Curved Portion | | Bottom Portion | |
| | | T.L. | O.L. | T.L. | O.L. | T.L. | O.L. |
| Example 1 | Thickness (mm) | 1.0 | 19 | 3.0 | 17 | 2.0 | 18 |
| | Bubble Cont. (%) | 0.4 | 4.0 | 0.5 | 4.5 | 0.4 | 4.6 |
| | OH Conc. (ppm) | 150 | 50 | 155 | 51 | 155 | 48 |
| Comparative Example 1 | Thickness (mm) | 0.0 | 20 | 2.0 | 18 | 2.0 | 18 |
| | Bubble Cont. (%) | 2.0 | 4.0 | 1.0 | 4.5 | 0.3 | 4.6 |
| | OH Conc. (ppm) | 53 | 52 | 54 | 50 | 56 | 52 |
| Comparative Example 2 | Thickness (mm) | 1.0 | 19 | 1.0 | 19 | 1.0 | 19 |
| | Bubble Cont. (%) | 0.4 | 8.0 | 0.5 | 8.5 | 0.4 | 9.0 |
| | OH Conc. (ppm) | 152 | 110 | 150 | 112 | 149 | 109 |

T.L. - Transparent Layer

O.L. - Opaque Layer

SECTIONAL VIEWS OF WALLS OF CYLINDRICAL PORTIONS OF CRUCIBLES BEFORE USE

Comparative Example 2

Comparative Example 1

Example 1

FIG. 3

| Sample No. | Items | Measuring Positions | | | | | |
|---|---|---|---|---|---|---|---|
| | | Cylindrical Portion | | Curved Portion | | Bottom Portion | |
| | | T.L. | O.L. | T.L. | O.L. | T.L. | O.L. |
| Example 1 | Thickness (mm) | 1.0 | 19 | 3.0 | 17 | 2.0 | 18 |
| | Bubble Cont. (%) | 0.4 | 4.0 | 0.5 | 4.5 | 0.4 | 4.6 |
| | OH Conc. (ppm) | 150 | 50 | 155 | 51 | 155 | 48 |
| Comparative Example 1 | Thickness (mm) | 0.0 | 20 | 2.0 | 18 | 2.0 | 18 |
| | Bubble Cont. (%) | 2.0 | 4.0 | 1.0 | 4.5 | 0.3 | 4.6 |
| | OH Conc. (ppm) | 53 | 52 | 54 | 50 | 56 | 52 |
| Comparative Example 2 | Thickness (mm) | 1.0 | 19 | 1.0 | 19 | 1.0 | 19 |
| | Bubble Cont. (%) | 0.4 | 8.0 | 0.5 | 8.5 | 0.4 | 9.0 |
| | OH Conc. (ppm) | 152 | 110 | 150 | 112 | 149 | 109 |

T.L. - Transparent Layer

O.L. - Opaque Layer

SECTIONAL VIEWS OF WALLS OF
CYLINDRICAL PORTIONS OF CRUCIBLES AFTER USE

Comparative Example 2

Comparative Example 1

Example 1

FIG. 5

| Sample No. | Crystallization Rate (%) | Observation with the Naked Eye | | |
|---|---|---|---|---|
| | | Cylindrical Portion | | |
| | | Transparent Layer | Opaque Layer | |
| Example 1 | 75 | | | |
| Comparative Example 1 | 50 | Bubbles Exposed | | |
| Comparative Example 2 | 45 | | | Conspicuous Expansion of Bubbles |

QUART CRUCIBLE WITH LARGE DIAMETER FOR PULLING SINGLE CRYSTAL AND METHOD OF PRODUCING THE SAME

CROSS REFERENCE TO RELATED APPLICATIONS

This application is a divisional of U.S. patent application Ser. No. 09/153,066, filed Sept. 15, 1998, now U.S. Pat. No. 5,989,021. The subject matter of application Ser. No. 09/153,066 is hereby incorporated by reference.

FIELD OF THE INVENTION

The present invention relates to a silica glass crucible which is used for pulling a silicon single crystal and a method of producing the same. More particularly, the present invention relates to a large diameter crucible with an inner diameter of 22 inches or more which is used for pulling a single crystal and a method of producing the same.

DESCRIPTION OF THE RELATED ART

Conventionally, in producing a single crystal such as a single crystal silicon semiconductor material, the so-called "Czochralski" method has been widely adopted. According to the method, polycrystalline silicon is molten in a vessel and a seed crystal is dipped at its tip end portion into the melt. Then, the seed is pulled while it is being rotated so that a single crystal is grown on the seed with the same crystallographic orientation.

As the vessel adapted for the pulling of a single crystal, a quartz glass crucible is generally used. The quartz crucible is classified in accordance with the external appearance entailed by the difference in the production methods into a transparent crucible having a relatively low bubble content and an opaque crucible having a high content of minute bubbles to provide an opaque appearance. The latter crucible will hereinafter be referred to as the "opaque crucible".

The opaque crucible is produced by a process in which quartz powder is introduced into a mold to be accumulated to form a layer along the inner surface of the mold. The layer of the quartz powder is then heated at the inner surface thereof while the mold is being rotated to produce a crucible of a glass having a relatively high bubble content. The opaque quartz crucible is advantageous in that it has a higher strength as compared with a transparent crucible and it is relatively easy to form a large size crucible. Further, minute bubbles contained in the opaque crucible contribute to uniformize the thermal distribution. From the reasons stated above, the opaque crucible has widely been used in practice.

It should however be noted that with the conventional crucible of opaque type it has been experienced in the process of producing a single crystal that crystallization becomes unstable with the result that the yield is decreased. There may be several reasons for the instability of crystallization. Among the reasons for the instability, one which is caused by the crucible is that the inner surface of the crucible is eroded due to a reaction under an elevated temperature between the silicon melt and the quartz glass so that irregularities are produced in the inner surface of the crucible. As the erosion further progresses, the bubbles which have been contained in the crucible are exposed to silicon melt. When the irregularities are thus produced in the location where the crucible is kept in contact with the silicon melt, the surface of the melt cannot be lowered smoothly as the quantity of the melt decreases causing fluctuations of the melt surface. It should further be pointed out that minute projections produced in the roughened surface of the crucible can become nucleus of crystallization of quartz glass forming spotty cristobalites on the quartz crucible. The crystals thus formed may be separated from the crucible as the pulling process progresses and fallen into the silicon melt. The crystals thus fallen into the silicon melt will have an adverse effect on the growth of the crystal which is being pulled.

A further problem is that metallic impurities may be concentrated in the vicinity of the inner surface of the quartz crucible, for example, at the surfaces of the minute bubbles and the concentrated metallic impurities are heated in the process of pulling the crystal to thereby enhance the crystallization of the cristobalites producing spotty cristobalites. From similar reasons, it is not preferable that at the time when the crucible is formed the crucible has minute projections and scratches which lead to a result that metallic impurities precipitate in the neighborhood thereof.

In order to solve such problems as above, a method is disclosed in Japanese Patent Publication No. 5-85515, wherein a mold with a high gas permeability is used and with the use of the mold a crucible is produced in such a manner that the bubble content in an outer peripheral portion is higher than that in an inner peripheral portion. The method comprises the steps of: feeding quartz powder along the inner surface of a rotating mold with a gas permeability to form a piled up layer of the quartz powder; melting the layer of the quartz powder by heat radiated from a central portion of the inside space of the mold; and during the melting, removing gas in the bulk of the layer of the quartz powder through the mold wall by reducing pressure in the outer peripheral portion of the mold, thereby a quartz crucible being produced. According to this method, suspension of pressure reducing operation leads to a result that bubbles are retained in the crucible in such a state as bubbles included in the bulk are attracted toward an outer peripheral portion thereof and the bubbles can be fixedly retained at respective intended positions. In such conditions, a crucible wherein a bubble content in an outer portion is higher as compared with that in an inner portion can be produced. This method is not enough to solve such problems as noted above, since minute bubbles still remain in an inner peripheral portion of the crucible, as described in the publication.

Another method is disclosed in Japanese Patent Publication No. 4-22861, which comprises a transparent inner quartz glass layer of a predetermined thickness with substantially no bubbles and an opaque quartz glass outer layer with bubbles. This method is carried out by the steps of: rotating a substrate of first silicon dioxide containing bubbles in the bulk; forming a high temperature gas atmosphere in the inside space of the substrate while rotating the substrate; feeding second silicon dioxide powder into the high temperature gas atmosphere to have the second silicon dioxide powder molten at least partly; and directing the second silicon dioxide powder toward an inner surface of the substrate to have the second silicon dioxide powder deposited on the inner surface of the substrate.

The substrate of silicon dioxide may be a ready made one, or produced by the method comprising the steps of: feeding the first silicon dioxide powder along the inner surface of the mold to pile up the first powder into a layered structure; heating the layered structure from the inside space of the mold to have the first silicon dioxide powder molten. While the above mentioned steps are effected to form the substrate, formation of the inner transparent quartz glass layer substantially free of bubbles may be completed.

With the latter method, the above problem which is encountered with during pulling a semiconductor single crystal can be effectively solved, since a transparent silica glass inner layer substantially free of bubbles with a very small bubble content can be formed. In the recent development in the art, a trend is seen that a diameter of a single crystal pulled in a crucible of this kind becomes progressively larger and thereby an inner diameter of the crucible also keeps on increasing. It was found that a crucible of this kind with an inner diameter more than 22 inches can not be satisfactorily produced by the above method.

A crucible produced by the method has a very high bubble content of 5% or more and a high average concentration of OH group in the opaque silica glass layer used as the substrate. With a crucible having an inner diameter more than 22 inches, thermal expansion of bubbles in the bulk of the substrate becomes large and thereby the inner surface is in danger of deformation, since the heat supply during pulling of a single crystal is abundant. In the case of a high concentration of OH group, as a viscosity of the glass is lowered, the wall of the crucible is deformed.

SUMMARY OF THE INVENTION

With the foregoing drawbacks of the related art in view, it is an object of this invention to provide a quartz crucible which practically has none of the problems especially with a small deformation in a condition of abundant heat supply to a large diameter crucible with an inner diameter of 22 inches or more and to provide a method of producing the same.

The invention provides a novel method of producing a large diameter quartz crucible with an inner diameter of 22 inches or more, being composed of an opaque outer layer having a high bubble content and a transparent inner layer being substantially free of bubble, which crucible is used for pulling a single crystal, comprising the steps of: feeding first silicon dioxide powder along an inner surface of a rotating mold having a gas permeable wall to form a piled up layer of the first silicon dioxide powder; heating the piled up layer from the inside space of the mold to have the first silicon dioxide powder molten to provide the opaque outer layer as a substrate, while vacuum suction is effected through the wall; generating a high temperature gas atmosphere in an inside space of the substrate during or after the formation of the opaque outer layer; feeding second silicon dioxide powder into the high temperature gas atmosphere to have the second silicon dioxide powder molten at least partly; and directing the second silicon dioxide powder in an at least partly molten form toward an inner surface of the substrate to have the second silicon dioxide powder deposited on the inner surface of the substrate to thereby form the transparent inner layer thereon, the transparent inner layer being of a predetermined thickness and substantially free of bubbles. The second silicon dioxide powder fed into the high temperature gas atmosphere is preferably synthetic quartz powder.

A crucible according to the present invention has an inner diameter of 22 inches or more and comprises an opaque outer layer containing bubbles of 10 μm to 250 μm in diameter and of 5 mm to 20 mm in thickness, and a transparent inner layer of 0.5% or less in a bubble content and of 0.3 mm or more in thickness which is molten and integrated with the outer layer, wherein the opaque silica glass outer layer has an OH group concentration of 80 ppm or less, has bubbles with gas pressure in bubbles lower than atmospheric pressure so that a volume expansion ratio of the bubbles is minimized when being heated in condition of pulling a single crystal. The volume expansion ratio of the bubbles of the opaque silica glass layer is preferably 15 times or less, more preferably 10 times or less when the crucible is left for 2 hours at 1600° C.

A large diameter crucible for pulling a semiconductor single crystal, which is produced according to the method of the present invention shows a very small volume expansion of the bubbles in the outer layer when the outer layer is heated and hence even when the crucible is used at a very high temperature there is no possibility of deformation of the crucible due to the volume expansion of the bubbles. Since a concentration of OH group in the outer layer is low, a quartz glass viscosity of the outer layer is kept large enough to prevent the deformation of the crucible due to a low viscosity.

The above and other objects, features and advantages of the present invention will become more apparent from the following description when making reference to the detailed description and the accompanying sheet of drawing in which a preferred structural embodiment incorporating the principles of the present invention is shown by way of illustrative example.

BRIEF DESCRIPTION OF THE DRAWINGS

FIG. 3 is a table showing a thickness, a bubble content and an OH concentration at different positions in the state of before use of the quartz crucibles produced in Example 1 and Comparative Examples 1 and 2.

FIG. 5 is a table showing bubble conditions in the state of after use of the quartz crucibles produced in Example 1 and Comparative Examples 1 and 2.

DETAILED DESCRIPTION OF THE INVENTION

Figure 1:
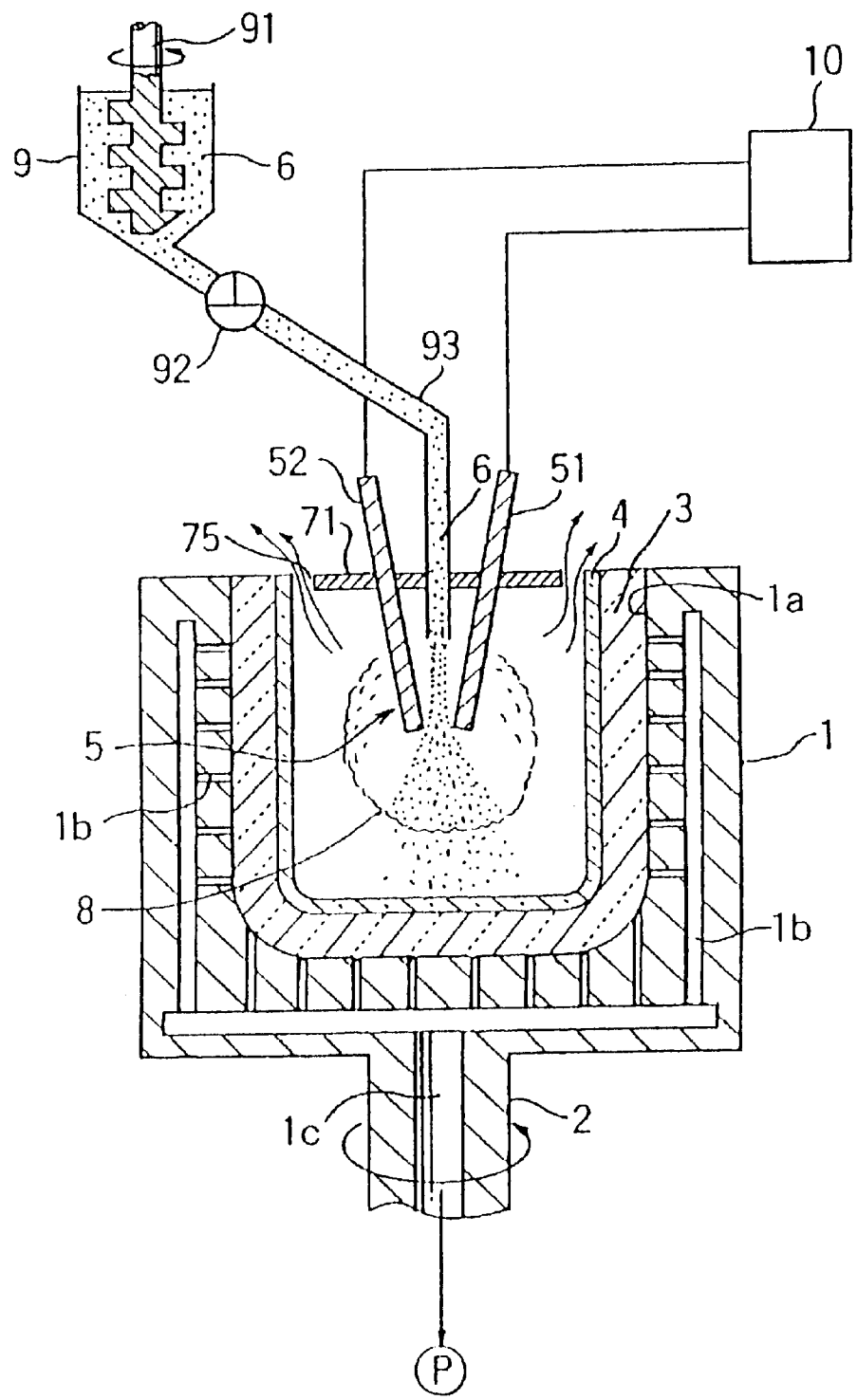
FIG. 1 is a schematic sectional view of an apparatus of producing a quartz glass crucible for carrying out a method according to the present invention.

An example of the present invention will be described with reference to the accompanying drawings. In FIG. 1, a rotating mold 1 is on a rotary shaft 2. A cavity 1a is formed in the mold 1. The mold 1 has a number of gas suction paths 1b formed in the wall of the mold 1. The gas suction paths 1b are connected with an evacuation pump (P) by way of a connection path 1c formed in the rotary shaft 2.

An opaque silica glass outer layer, that is to say, a substrate 3 is made in the cavity 1a. First silicon dioxide powder, crystalline or amorphous, is fed into the rotating mold 1 to pile up the powder in a layered structure along the inner surface of the mold 1 and thereby to produce a preform in a shape of a crucible, then the preform is heated from the inside space of the preform to have it molten and lastly the preform is cooled down to make the substrate 3. As show in FIG. 1, an arc discharge device including carbon electrodes 51, 52 which are connected with a electric source 10 may be used as a heat source 5 in the inside space of the preform. Such a method of making the substrate is detailed in Japanese Patent Publication No. 4-22861.

In the course of production of the substrate 3, gas is removed by vacuum suction from the quartz glass layer in a molten state through the mold 1 by the evacuation pump (P).

A vacuum degree is gradually raised with the progress of the melt of the heated substrate, because gas permeability through the heated substrate is lowered due to the silicon dioxide powder being molten. The vacuum degree is raised by 300 mmHg or more from the reading value before heating the substrate. At a point where a vacuum degree becomes higher by 300 mmHg from the reading value before heating, a transparent inner layer having a small number of bubbles is formed up to a depth of several mm in the inner surface of the preform of the silicon dioxide powder. If such a reduced pressure condition is continued to be kept, the preform of the silicon dioxide powder becomes to be softened to an unnecessary extent so that the bottom portion of the preform is displaced toward the outer periphery by a centrifugal force of rotation of the mold 1 and a thickness of the bottom portion thereof may become thin to excess. If such an adverse situation seems to occur, a vacuum degree is preferably adjusted, in advance, to a lower value such as 120 mmHg by any suitable means, for example, by throttling an opening degree of the valve in the connection path when the first silicon dioxide powder is initially molten or any time in the course of melting it. If circumstances require, the vacuum suction may be suspended completely and the vacuum degree may be lowered to 0 mmHg.

In the course of producing the substrate 3 including the vacuum suction, gas retained in the first silicon dioxide powder is drawn outwardly, a content of gas in the bulk is decreased and a bubble size is also decreased. According to the present invention, a diameter of the bubble is preferably in the range of 10 $\mu$m to 250 $\mu$m. A concentration of OH group in the substrate 3 is decreased as the result of the vacuum suction. According to the present invention, a concentration of OH group is preferably 80 ppm or less. As described above, it was found that a substrate 3 which is preferable in terms of a concentration of OH group and a bubble size can be produced by increasing the vacuum degree by at least 300 mmHg from the reading value before the melting. A time required for increasing the vacuum degree by 300 mmHg from the reading value before the melting is usually ranged 150 sec. to 250 sec.

During the course of producing the above substrate 3, after a predetermined period, for example 120 sec., elapsed from the start of the melting of the inner surface, formation of a transparent silica glass inner layer 4 is started. An apparatus depicted in FIG. 1 is equipped with a supply tank 9 for second silicon dioxide powder 6. The tank 9 has a stirring blade 91 and supplies an adjusted quantity of second silicon dioxide powder 6 by a measuring feeder 92. In the apparatus of FIG. 1, an open end of the nozzle 93 is positioned between a pair of carbon electrodes 51, 52. The apparatus also has a lid 71 which covers the upper opening of the substrate 3 with an annular slit 75 uncovered.

When arc discharge is conducted with both carbon electrodes 51, 52 which form a heat source 5, while the lid 71 is placed to cover the upper opening of the substrate 3, a high temperature gas atmosphere 8 is generated in the inside space of the substrate 3. There may be used as the heat source 5 a plasma discharge device other than the arc discharge device with the carbon electrodes 51, 52. An adjusted quantity of second silicon dioxide powder 6 is fed from the nozzle 93 into the high temperature atmosphere 8. The supplied second silicon dioxide powder 6 is then partly molten under the influence of the high temperature gas atmosphere 8 and directed toward the inner surface of the substrate 3 with at least a part of the powder 6 in a molten state. The powder 6 is deposited on the inner surface of the substrate 3 which is already in a molten state to integrally form a transparent silica glass inner layer 4 on the substrate 3. A uniform inner layer 4 on the inner surface of the substrate 3 can be produced, if necessary, by properly moving the heat source 5 along the inner surface of the substrate 3. A high temperature gas flows out through the annular slit 75 between the substrate 3 and the lid 71 in such a manner as shown by arrows indicated in FIG. 2.

An inner layer 4 formed by this method has a very small bubble content. No bubbles can be observed directly with the naked eye and there are very few bubbles, which cannot be found with the naked eye, and which are of a diameter 20 $\mu$m or more. It is necessary for an inner layer to be formed at a thickness of at least 0.3 mm, or preferably 0.8 mm or more, or more preferably 1.0 mm or more.

EXAMPLE 1

According to the method of the present invention, a quartz crucible with an inner diameter of 91.4 cm was produced. 100 kg of first quartz powder of 150 $\mu$m to 300 $\mu$m in grain diameter was fed into a mold 1 and a preform of the first powder was formed by the help of a centrifugal force. While the mold 1 was being rotated at a speed of 100 rpm, the preform was heated from the inside space of the preform to form an opaque silica glass outer layer, namely, a substrate 3 with bubbles in the bulk. The mold which is made of carbon has suction paths connected to a vacuum pump.

First quartz powder fed into the mold 1 was shaped into a preform in which the first powder is piled up in a layered structure along the inner surface. The preform was heated on the inner surface thereof. In advance of the heating, a vacuum pump was energized and gas in the preform was evacuated through the suction paths of the mold 1. The vacuum degree in the mold 1 was 250 mmHg against atmospheric pressure of 0 mmHg. Then heating was started by conducting arc discharge with the carbon electrodes. Once the heating was started, the first powder in the inner surface of the preform was molten, and vacuum degree was increased up to 500 mmHg. When 120 sec. elapsed from the initiation of the process, a suction was weakened to adjust the vacuum degree to 100 mmHg. Thereafter, the arc discharge was further continued so as to form a high temperature gas atmosphere in the inside space of the substrate 3 formed in the mold 1.

When 120 sec. elapsed from the initiation of the heating, second natural quartz powder of the same diameter in grain size as the first quartz powder used to produce the substrate 3 was fed into the high temperature gas atmosphere in the inside space of the substrate 3 at a rate of 125 g/min to form a transparent silica layer 4 of 1.0 mm thick. A time period of the heating for formation of a transparent silica glass inner layer 4 was one hour. When 5 min. elapsed after the end of the heating, a produced quartz crucible was taken out of the mold 1.

Figure 2:
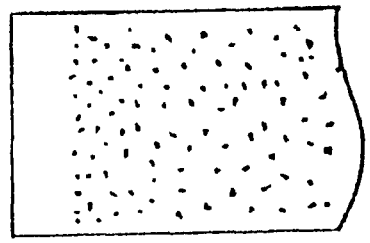
FIG. 2 is three sectional views of wall structures in the state of before use of the quartz crucibles produced in Example 1 and Comparative Examples 1 and 2.
Figure 2:
Figure 2:
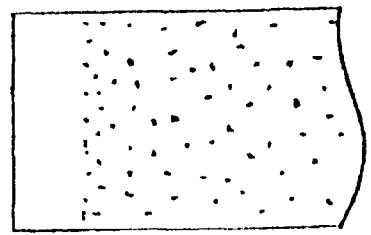

Samples were cut from such portions as the side wall, the bottom portion and the curved portion therebetween. Measurements of the samples on thicknesses of the outer and inner layers, a bubble content and, a concentration of OH group of each sample and observations on the states of bubbles thereof were conducted. The obtained states of bubbles are shown in FIG. 2 and the obtained measurements are shown in FIG. 3.

Comparative Example 1

In this Comparative Example 1, a quartz crucible of the same dimension as the one described in Example 1 was produced in such a method as disclosed in Japanese Patent Publication No. 5-85515, wherein the crucible is produced only by vacuum suction through a mold and an internal heating. Conditions of vacuum suction and internal heating were the same as those of Example 1.

Comparative Example 2

In this Comparative Example 2, a quartz crucible of the same dimension as the one described in Example 1 was produced in such a method disclosed in Japanese Patent Publication No. 4-22861. The method of Comparative Example 2 is the same as that of Example 1 with the exception that vacuum suction through the mold is not applied.

Samples were cut from the quartz crucibles produced in Comparative Examples 1 and 2 in a similar way to that of Example 1 to conduct similar measurements and observations on the samples in Example 1. The results are shown in FIGS. 2 and 3.

Figure 4:
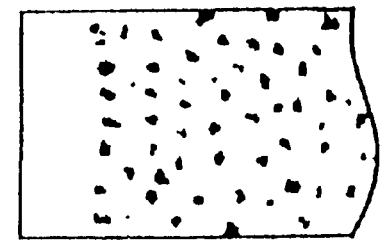
FIG. 4 is three sectional views of wall structures in the state of after use of the quartz crucibles produced in Example 1 and Comparative Examples 1 and 2.
Figure 4:
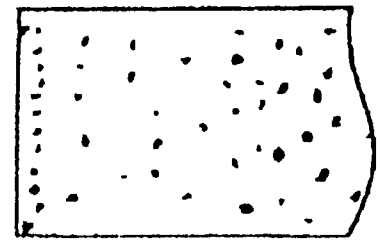
Figure 4:
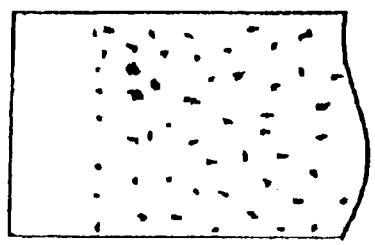

The quartz crucibles produced in Example 1 and Comparative Examples 1 and 2 were employed for pulling silicon single crystals and crystallization rates of the obtained silicon single crystals were measured. When pulling a single crystal by the use of the quartz crucibles, influences on the state of bubbles therein were also observed. The results are shown in FIGS. 4 and 5. Conditions to which the crucibles were exposed are regarded to be equivalent to leaving them for 2 hours at 1600° C.

As can be seen apparently from FIG. 3, the crucible produced in Example 1, that is, by a method of the present invention has a conspicuously decreased bubble content in the transparent silica glass inner layer as compared with the crucible produced in Comparative Example 1. Moreover, the bubble content in the opaque silica glass outer layer of the crucible of Example 1 is decreased to a half or less of that of the crucible produced in Comparative Example 2. The concentration of OH group in the crucible of Example 1 is also a half or less of that of the crucible of Comparative Example 2. As can be seen from FIGS. 4 and 5, when comparing the crucible of Example 1 with that of Comparative Example 1, both the crucibles being used for pulling up silicon single crystals, on the side walls thereof which are most important for pulling up silicon single crystals, the greater part of the transparent layer of the side wall of the crucible of Example 1 is left unchanged, but in contrast a number of bubbles are shown up in the surface of the inner layer of that of the crucible of Comparative Example 1. When comparing the crucible of Example 1 with that of Comparative Example 2, expansion of bubbles in the outer layer of the crucible of Comparative Example 2 is remarkably observed. The expansion ratio of the bubbles in the outer layer of the used crucible of Comparative Example 2 is a very large value of 20 times and that of Example 1 is a very low value of 10 times. As a result, a crucible produced by the method according to the present invention can keep a stability in shape during the course of pulling a silicon single crystal.

Obviously various minor changes and modifications of the present invention are possible in the light of the above teaching. It is therefore to be understood that within the scope of the appended claims the invention may be practiced otherwise than as specifically described.

What is claimed is:

1. A method of producing a large diameter quartz crucible with an inner diameter of 22 inches or more, being composed of an opaque outer layer having a high bubble content and a transparent inner layer being substantially free of bubble, which crucible is used for pulling a single crystal, comprising the steps of: feeding first silicon dioxide powder along an inner surface of a rotating mold having a gas permeable wall to form a piled up layer of the first silicon dioxide powder; heating the piled up layer from the inside space of the mold to have the first silicon dioxide powder molten to provide the opaque outer layer as a substrate, while vacuum suction is effected through the wall; generating a high temperature gas atmosphere in an inside space of the substrate during or after the formation of the opaque outer layer; feeding second silicon dioxide powder into the high temperature gas atmosphere to have the second silicon dioxide powder molten at least partly; and directing the second silicon dioxide powder in an at least partly molten form toward an inner surface of the substrate to have the second silicon dioxide powder deposited on the inner surface of the substrate to thereby form the transparent inner layer thereon, the transparent inner layer being substantially free of bubbles.

2. A method as claimed in claim 1, wherein the second silicon dioxide powder is synthetic quartz powder.

* * * * *